(12) United States Patent
Kotani et al.

(10) Patent No.: US 6,901,577 B2
(45) Date of Patent: May 31, 2005

(54) PATTERN FORMING METHOD AND SEMICONDUCTOR DEVICE MANUFACTURED BY USING SAID PATTERN FORMING METHOD

(75) Inventors: Toshiya Kotani, Sagamihara (JP); Satoshi Tanaka, Kawasaki (JP); Soichi Inoue, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 162 days.

(21) Appl. No.: 10/183,572

(22) Filed: Jun. 28, 2002

(65) Prior Publication Data

US 2003/0001155 A1 Jan. 2, 2003

(30) Foreign Application Priority Data

Jun. 29, 2001 (JP) ........................................ 2001-199647

(51) Int. Cl.[7] ............................ G06F 17/50; G06F 9/45
(52) U.S. Cl. ........................... 716/21; 716/10; 716/11; 716/19
(58) Field of Search ....................................... 716/1–21

(56) References Cited

U.S. PATENT DOCUMENTS

| | | | | | |
|---|---|---|---|---|---|
| 5,278,105 A | * | 1/1994 | Eden et al. | ................. | 438/129 |
| 5,379,233 A | * | 1/1995 | Tripathi et al. | ................. | 716/8 |
| 5,903,011 A | * | 5/1999 | Hatanaka | .................... | 257/48 |
| 2002/0184606 A1 | * | 12/2002 | Ohba et al. | .................... | 716/11 |

FOREIGN PATENT DOCUMENTS

| | | | | |
|---|---|---|---|---|
| JP | 3-180041 | 8/1991 | | |
| JP | 4-130709 | 5/1992 | | |
| JP | 9-319067 | 12/1997 | | |
| JP | 2000269190 A | * | 9/2000 | ......... H01L/21/027 |

OTHER PUBLICATIONS

Sato et al., "Manufacture of Photomask", Patent Abstracts of Japan, Publication No. 02–236549, Sep. 19, 1990.

* cited by examiner

*Primary Examiner*—Leigh M. Garbowski
(74) *Attorney, Agent, or Firm*—Finnegan, Henderson, Farabow, Garrett & Dunner, L.L.P.

(57) ABSTRACT

A pattern forming method includes determining an allowable value of an etching conversion difference, obtaining a maximum distance between patterns generating the etching conversion difference within the allowable value, the patterns including main patterns or both main patterns and a dummy pattern, preparing a first design layout in which a first distance between the main patterns is smaller than the maximum distance, or a second design layout in which a second distance between the main patterns and the dummy pattern is smaller than the maximum distance, performing a design data conversion based on the first or second design layout to form first or second design data, and forming the main patterns by using the first design data, or forming both the main patterns and the dummy pattern by using the second design data.

44 Claims, 6 Drawing Sheets

PATTERN FORMING METHOD AND SEMICONDUCTOR DEVICE MANUFACTURED BY USING SAID PATTERN FORMING METHOD

CROSS-REFERENCE TO RELATED APPLICATIONS

This application is based upon and claims the benefit of priority from the prior Japanese Patent Application No. 2001-199647, filed Jun. 29, 2001, the entire contents of which are incorporated herein by reference.

BACKGROUND OF THE INVENTION

1. Field of the Invention

The present invention relates to a pattern forming method and a semiconductor device manufactured by using the pattern forming method.

2. Description of the Related Art

In recent years, the technology of manufacturing a semiconductor device has progressed to arrive at the stage that a semiconductor device having a minimum processing size of 0.18 $\mu$m can be manufactured nowadays on a mass production basis. This prominent miniaturization has been achieved by drastic progress in fine pattern forming technologies such as mask processing technology, photolithography technology and etching technology.

In the era when the pattern size was sufficiently large, a planar shape of a desired LSI pattern was depicted as it was on a wafer as a design pattern so as to form a mask pattern having a high fidelity to the design pattern, and the mask pattern was transferred onto the wafer by a projecting optical system, followed by etching the underlying layer, thereby forming a desired LSI pattern substantially equal to the design pattern on the wafer.

However, with progress in the miniaturization of the pattern, it has been rendered difficult to form a pattern with high fidelity in each process, giving rise to the problem that the final finish pattern fails to conform with the design pattern. Particularly, in the lithography and etching processes, which are most important for achieving fine processing, a pattern layout arranged in the periphery of a desired pattern, i.e., the peripheral pattern environment, greatly affects the dimensional accuracy of the desired pattern.

Under the circumstances, proposed in, for example, Jpn. Pat. KOKAI Publication No. 9-319067 are an OPC (Optical Proximity Correction) technology, a PPC (Process Proximity Correction) technology, etc., in which a dummy pattern is imparted in advance to a design pattern for forming the size after the processing in a desired pattern so as to suppress the influence described above. The OPC technology noted above denotes the technology for correcting the change in size generated in the lithography process by a pattern. On the other hand, the PPC technology noted above denotes the technology for correcting not only the change in size generated in the lithography process but also the change in size generated by the mask and the etching process by a pattern.

In the case of employing OPC technology, it is certainly possible to suppress the process conversion difference, i.e., the difference between the resist size and the design size, derived from the pattern environment in the lithography process to a low level. However, even in the case of employing PPC technology, it was impossible in some cases to suppress completely the process conversion difference, i.e., the difference between the size after the etching and the resist size, derived from the pattern environment in the etching process. The process conversion difference in the etching process was generated mainly by two factors.

First of all, the process conversion difference was generated by the etched area in a large region hundreds of times as large as the region of the entire chip or the minimum pattern size that was to be processed. The technology of arranging a dummy pattern differing from a main pattern for controlling the area to be etched is disclosed in, for example, Japanese Patent Disclosure No. 2-236549, Japanese Patent Disclosure No. 3-180041, and Japanese Patent Disclosure No. 4-130709. In each of these prior arts, a dummy pattern is formed around a pattern that is to be processed in order to make the area to be etched within the chip as uniform as possible. In Japanese Patent Disclosure No. 3-180041 referred to above, a dummy pattern is arranged on an element separation region alone. On the other hand, in Japanese Patent Disclosure No. 4-130709 referred to above, a dummy pattern is arranged around an isolated pattern.

The second factor is the etching process conversion difference generated by only the distance between the pattern to be processed and the adjacent pattern. To be more specific, when a pattern is arranged in an isolated manner, the process size of the pattern after etching is rendered larger than the resist size after the lithography process. In order to suppress the conversion difference, it is necessary to make the size of the resist formed by the lithography process smaller than the desired size in view of the conversion difference generated in the etching process. However, the process margin that can be ensured by the lithography process is very small, with the result that it is very difficult to form a resist pattern smaller than the desired size and to ensure a required process margin. In other words, even in the case of employing PPC technology, it is very difficult to correct the increase in size in the isolated pattern derived from the etching process.

BRIEF SUMMARY OF THE INVENTION

According to a first aspect of the present invention, there is provided a pattern forming method, comprising determining an allowable value of an etching conversion difference; obtaining a maximum distance between patterns generating the etching conversion difference within the allowable value, the patterns including main patterns or both main patterns and a dummy pattern; preparing a first design layout in which a first distance between the main patterns is smaller than the maximum distance, or a second design layout in which a second distance between the main patterns and the dummy pattern is smaller than the maximum distance; performing a design data conversion based on the first or second design layout to form first or second design data; and forming the main patterns by using the first design data, or forming both the main patterns and the dummy pattern by using the second design data.

According to a second aspect of the present invention, there is provided a pattern forming method, comprising determining an allowable value of an etching conversion difference; obtaining a maximum distance between patterns generating the etching conversion difference within the allowable value, the patterns including main patterns or both main patterns and a dummy pattern; determining a third distance between adjacent element regions; preparing in accordance with the third distance a design layout in which a fourth distance between the main patterns and edge portions of the element regions is not larger than a first defined value; performing conversion of a design data in view of the design layout and a first distance between the main patterns to prepare a first design data in the case where the third distance is not larger than a second defined value, or determining a width of the dummy pattern and performing conversion of a design data in view of the design layout, the width of the dummy pattern, and a second distance between the main patterns and the dummy pattern to prepare a second design data in the case where the third distance is not smaller than the second defined value, each of the first and second distances being not larger than the maximum distance; and forming the main patterns by using the first design data or forming both the main patterns and the dummy pattern by using the second design data.

Further, according to a third aspect of the present invention, there is provided a semiconductor device comprising main patterns arranged such that a distance between the patterns is not larger than a maximum distance between adjacent patterns, the maximum distance being defined from an etching conversion difference.

DETAILED DESCRIPTION OF THE INVENTION

Before describing each embodiment of the present invention, the dependence of the process conversion difference on the peripheral pattern environment will now be described.

Figure 1:
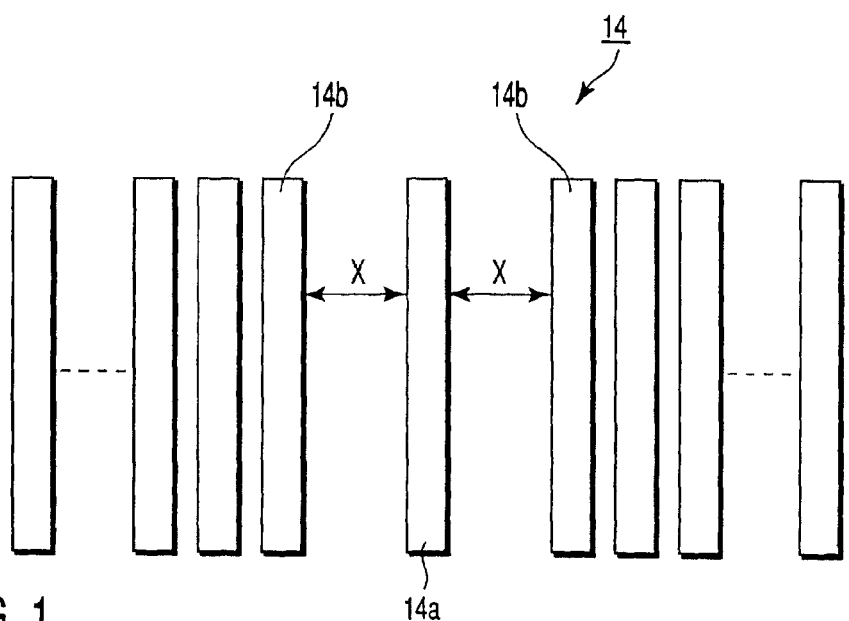
FIG. 1 exemplifies a mask pattern used for obtaining a process conversion difference by the etching of a gate pattern according to each embodiment of the present invention.

FIG. 1 exemplifies a mask pattern used for obtaining a process conversion difference by the etching of a gate pattern. As shown in FIG. 1, a main pattern 14a is selected from among the mask patterns 14, and the mask pattern 14 arranged in the vicinity of the selected main pattern 14a is used as an adjacent pattern 14b. It should be noted that the main pattern 14 and the adjacent pattern 14b are arranged apart from each other by a distance X, and the distance X is changed variously depending on the desired size. The process conversion difference by the etching of the gate pattern will now be studied by using these mask patterns 14.

Figure 2:
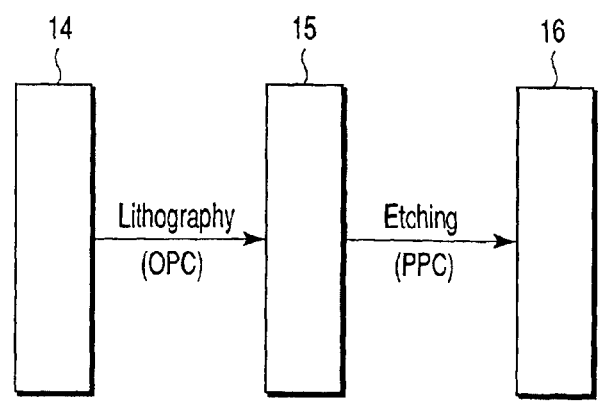
FIG. 2 schematically shows the flow for the pattern formation of a gate according to each embodiment of the present invention.

FIG. 2 schematically shows the flow of the pattern formation of a gate. As shown in FIG. 2, a resist pattern 15 is formed by lithography by using the mask pattern 14, and a gate pattern 16 is formed by etching using the resist pattern 15. In general, the pattern correction is performed by the lithography process using OPC (Optical Proximity Correction) technology. Also, in the etching process, pattern correction is performed by using PPC (Process Proximity Correction) technology.

Figure 3:
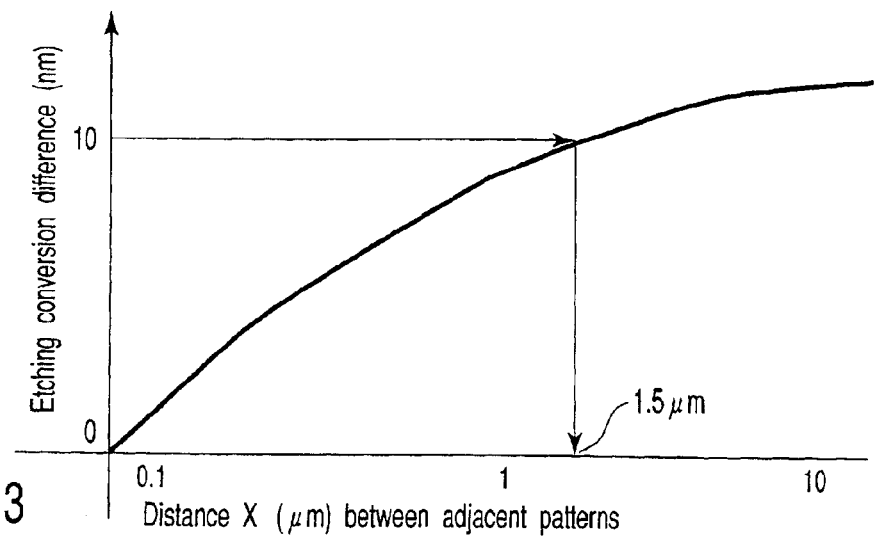
FIG. 3 shows the etching conversion difference accompanying the change in the distance between adjacent patterns according to each embodiment of the present invention.

FIG. 3 is a graph showing the etching conversion difference accompanying the change in the distance X between the adjacent mask patterns. The etching conversion difference noted above represents the process conversion difference by the etching, covering the case where the size of the resist pattern is subtracted from the size of the gate pattern. As shown in FIG. 3, the etching conversion difference increases with the increase in the distance X between the adjacent mask patterns 14, i.e., the distance X shown in FIG. 1 between the main pattern 14a and the adjacent pattern 14b. In other words, the size of the gate pattern 16 is rendered greater than the size of the resist pattern 15, if the adjacent pattern 14b is not present around the main pattern 14a so as to increase the degree of isolation of the main pattern 14a. It follows that the etching conversion difference changes depending on the distance X between the adjacent mask patterns 14.

Each embodiment of the present invention will now be described with reference to the accompanying drawings, with the above taken into consideration. Throughout the drawings, common portions are represented by common reference numerals.

[First Embodiment]

In the first embodiment, a dummy pattern is arranged in the design stage. The pattern forming method according to the first embodiment of the present invention is adapted for the formation of a custom-designed device pattern such as a DRAM.

Figure 4:
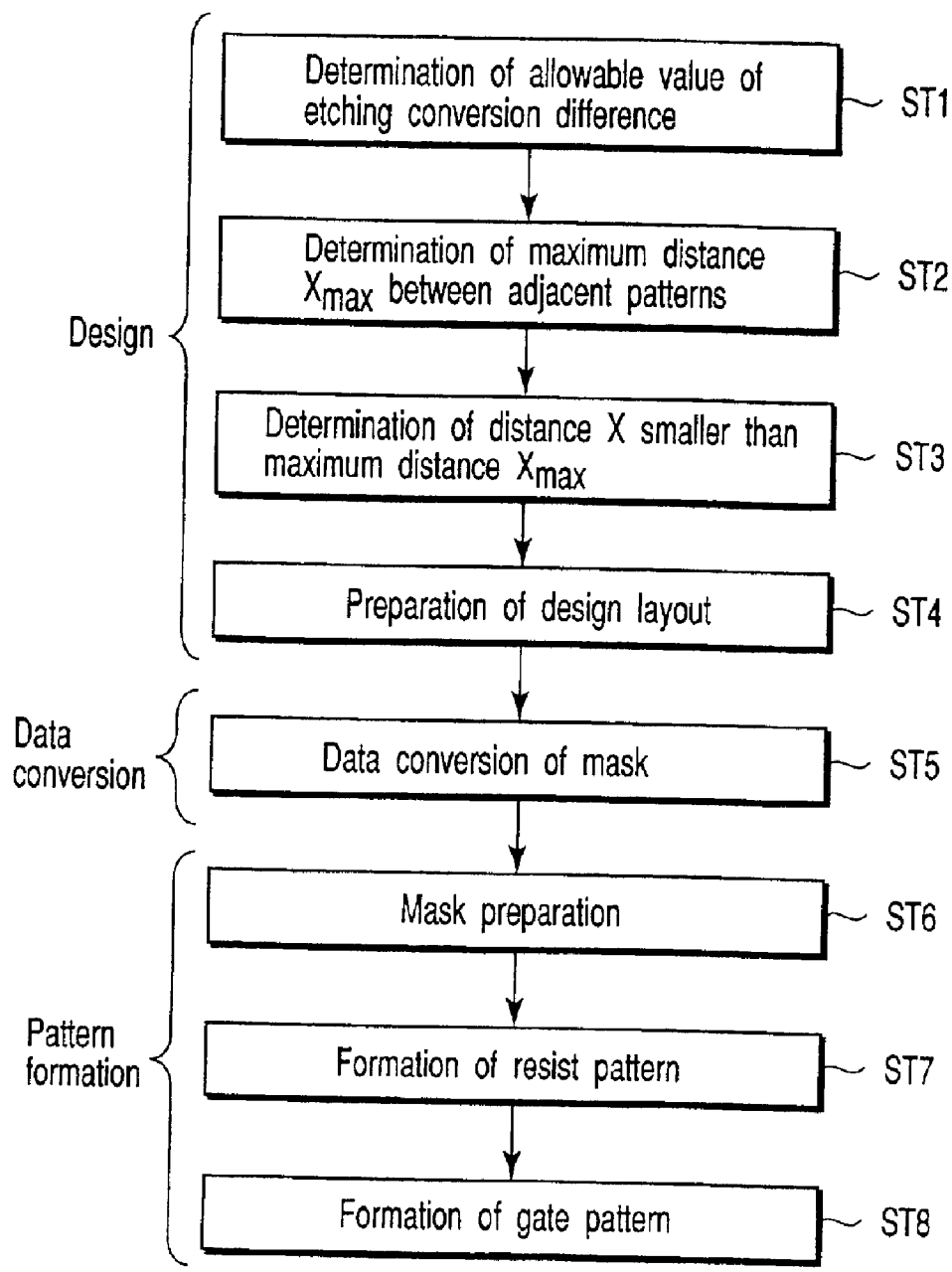
FIG. 4 is a flowchart showing the pattern forming method according to a first embodiment of the present invention.

FIG. 4 is a flowchart showing the pattern forming method according to the first embodiment of the present invention. The pattern forming method according to the first embodiment of the present invention will now be described with reference to the flowchart shown in FIG. 4.

First of all, the allowable value of the etching conversion difference is determined in respect of the allowable limit of the difference between the size of the gate pattern and the size of the resist pattern in the case where the size of the gate pattern is rendered larger than the size of the resist pattern (step ST1).

Then, a maximum distance $X_{max}$ between the adjacent patterns in the allowable value of the etching conversion difference is obtained by using the graph of FIG. 3 (step ST2). It should be noted that, in the graph of FIG. 3, the etching conversion difference changes in accordance with the change in the kind (e.g., the material) and the thickness of the film to be etched. Therefore, the maximum distance $X_{max}$ also changes depending on the change in the kind and thickness of the film to be etched. For example, the maximum distance $X_{max}$ in the case where the film to be etched is a polycrystalline silicon (polysilicon) film is smaller than the maximum distance $X_{max}$ in the case where the film to be etched is an insulating film. Also, the maximum distance $X_{max}$ decreases with the increase in the thickness of the film to be etched.

Figure 5A:
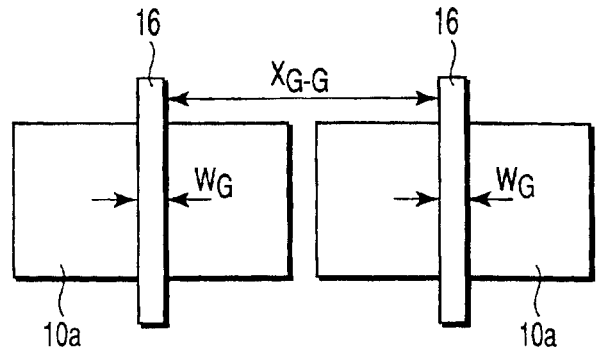
FIG. 5A shows a first layout according to the first embodiment of the present invention.
Figure 5B:
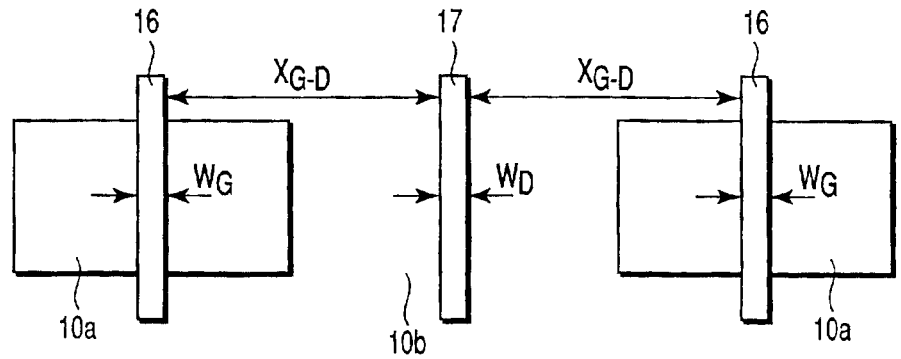
FIG. 5B shows a second layout according to the first embodiment of the present invention.

After determination of the maximum distance $X_{max}$, distances $X_{G-G}$ and $X_{G-D}$ between the adjacent patterns are determined for each layout by using two typical layouts shown in, for example, FIGS. 5A and 5B (step ST3). To be more specific, FIG. 5A shows the first layout. The first layout is the layout, covering the case where the distance between the adjacent gate patterns 16 is relatively small and a dummy pattern is not present between the adjacent patterns 16. In this case, the adjacent gate patterns 16 are arranged on element regions 10a apart from each other by the distance $X_{G-G}$ that is not larger than the maximum distance $X_{max}$. The distance $X_{G-G}$ between the adjacent gate patterns is called later herein the G-G distance $X_{G-G}$.

On the other hand, FIG. 5B shows the second layout. The second layout is the layout covering the case where the distance between the adjacent gate patterns is relatively large, and a dummy pattern 17 is interposed between the adjacent gate patterns 16. In this case, the gate patterns 16 are arranged on the element regions 10a apart from each other by the distance $X_{G-D}$, which is not larger than the maximum distance $X_{max}$, and the dummy pattern 17 is arranged on an element isolation region 10b. Since the dummy pattern 17 is formed on the element isolation region 10b, it is possible to suppress the influence on the device characteristics even in the case of forming the dummy pattern 17. The distance $X_{G-D}$ between the gate pattern 16 and the dummy pattern 17 is called herein the G-D distance $X_{G-D}$.

Concerning steps ST1 to ST3 described above, where, for example, the allowable value of the etching conversion difference is 10 nm, the maximum distance $X_{max}$ between the adjacent patterns is about 1.5 μm as apparent from the graph of FIG. 3. Therefore, the G-G distance $X_{G-G}$ or the G-D distance $X_{G-D}$ is set at a value not larger than 1.5 μm. In this case, the width $W_G$ of the gate pattern 16 is about 0.15 μm.

Incidentally, in order to miniaturize the element, it is desirable for the maximum distance $X_{max}$ between the adjacent patterns to be not larger than 5 μm. Also, in order to lower the etching conversion difference, it is desirable for the maximum distance $X_{max}$ between the adjacent patterns to be not larger than 10 times as the width $W_G$ of the gate pattern.

As described above, where the distance between the adjacent patterns 16 is relative long as shown in FIG. 5B, the design layout is prepared with the dummy pattern 17 arranged in the design stage (step ST4).

Then, the design data for the light exposure of a mask used for the pattern formation is converted on the basis of the design layout prepared in step ST4 noted above (step ST5).

Incidentally, an inspection to check that the G-G distance $X_{G-G}$ or the G-D distance $X_{G-D}$ is not larger than the maximum distance $X_{max}$ between the adjacent patterns, an inspection to see whether the dummy pattern 17 can be arranged, and an inspection to see whether the dummy pattern 17 is arranged on only the element isolation region 10b are performed by using a design rule checker (DRC) in the designing step, after completion of the designing step or in the design data conversion step.

Figure 6A:
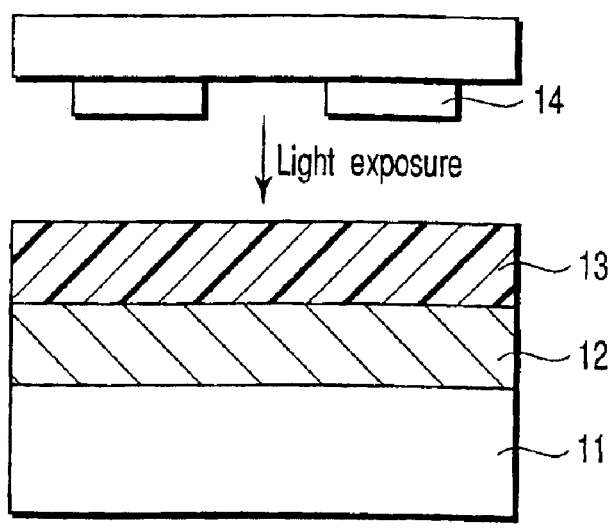
FIGS. 6A, 6B and 6C are cross sectional views showing the pattern forming steps according to the first and second embodiments of the present invention.
Figure 6B:
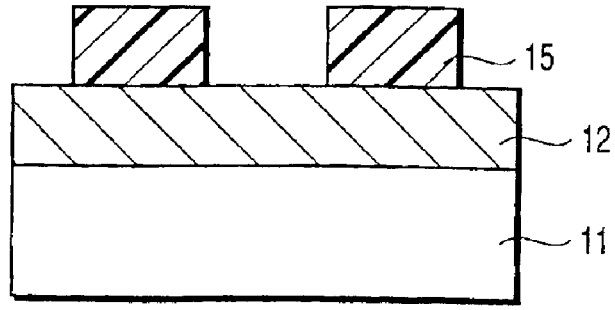

In the next step, a metal film 12 is formed on a semiconductor substrate 11 with an insulating film (not shown) interposed therebetween, followed by coating the metal film 12 with a resist layer 13, as shown in FIG. 6A. Then, the mask pattern 14 is prepared above the resist layer 13 by using the converted design data noted above (step ST6). Further, the resist layer 13 is patterned by photolithography by using the mask pattern 14 so as to form a resist pattern 15, as shown in FIG. 6B (step ST7).

Figure 6C:
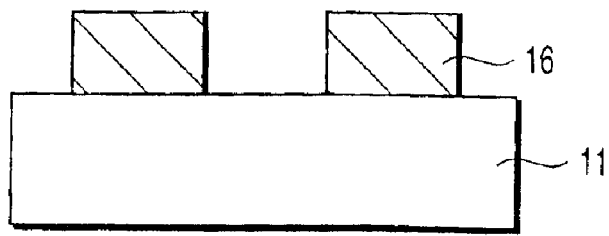

In the next step, the metal film 12 is selectively removed by etching using the resist pattern 15 so as to form a gate pattern 16, as shown in FIG. 6C. In this case, a dummy pattern is also formed. However, the dummy pattern thus formed is removed after formation of the gate pattern 16.

Incidentally, the pattern formation according to the first embodiment of the present invention described above is directed to the patterning of a gate. However, the first embodiment is not limited to the patterning of a gate. For example, the first embodiment of the present invention can also be applied to the patterning of, for example, a wiring.

Also, electron beam lithography can also employed in place of photolithography for forming the resist pattern 15. In this case, the resist layer 13 is patterned without using a mask and by using the converted design data.

According to the first embodiment of the present invention described above, the design layout is prepared by determining the maximum distance $X_{max}$ between the adjacent patterns such that the etching conversion difference is rendered not larger than the allowable value so as to determine the G-G distance $X_{G-G}$ or the G-D distance $X_{G-D}$. What should be noted is that a pattern put in an isolated state by a design rule is eliminated by imparting a restriction to the design rule so as to prevent the situation that the etching conversion difference is made larger than the allowable value. It follows that it is possible to correct a change in the size of the isolated pattern derived from the etching process so as to make it possible to achieve a pattern formation with a higher dimensional accuracy.

Further, an inspection to check that the G-G distance $X_{G-G}$ or the G-D distance $X_{G-D}$ is not larger than the maximum distance $X_{max}$ between the adjacent patterns, an inspection to see whether the dummy pattern 17 can be arranged, and an inspection to see whether the dummy pattern 17 is arranged on only the element isolation region 10b are applied to the data for the light exposure or the design data by using a design rule checker. As a result, it is possible to prepare a layout small in etching conversion difference on the element isolation region 10b that does not affect the device characteristics. It follows that it is possible to prevent the etching conversion difference from being made larger than the allowable value, e.g., 10 nm), so as to achieve pattern formation with a higher dimensional accuracy.

Incidentally, the example described above in conjunction with the first embodiment of the present invention covers the case where the dummy pattern 17 is arranged ideally. In actual pattern formation, however, many design restrictions are imposed. Therefore, it is desirable that the number of portions to which the particular design rule is applied to be as small as possible. To decrease the number of portions to which the design rule is applied as much as possible, the method described below is considered.

In the first embodiment of the present invention, the arrangement of the dummy pattern 17 is intended to decrease the etching conversion difference so as to ensure a lithography margin required for finishing in a desired size after etching. It should be noted that, where the gate pattern 16 is larger than the minimum processing size, the lithography margin is improved. Therefore, it is possible to make the design rule of the G-D distance $X_{G-D}$ more moderate than the design rule referred to in conjunction with the first embodiment of the present invention in respect of a gate pattern 16 thicker than the minimum processing size. It should be noted that the degree of freedom of the design can be increased by determining the design rule of the G-D distance $X_{G-D}$ in accordance with the width $W_G$ of the gate pattern 16. Further, in the gate pattern 16 thicker than about twice the minimum processing size, it is possible to ensure a sufficient lithography margin compared with the gate pattern 16 having the minimum processing size so as to make it unnecessary to apply the design rule. In other words, it suffices to arrange the dummy pattern 17 in accordance with the design rule described above in only the case where the width $W_G$ of the gate pattern 16 is smaller than twice the minimum processing size.

Figure 5C:
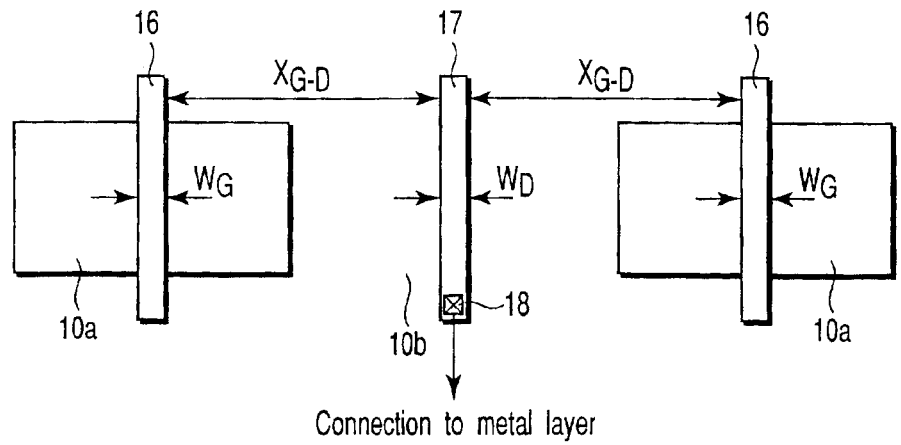
FIG. 5C shows another layout according to the first embodiment of the present invention.

Incidentally, if the potential of the dummy pattern 17 arranged in the vicinity of the gate pattern 16 is not fixed in this case, the dummy pattern 17 forms a floating gate so as to tend to have a detrimental effect on the device characteristics. In order to avoid this detrimental effect, it is possible to arrange a contact 18 on the dummy pattern 17 and to connect the contact 18 to a metal layer arranged above the dummy pattern 17, as shown in FIG. 5C. As a result, it is possible to fix the gate potential of the dummy pattern 17.

It should also be noted that the gate pattern 16 alone formed on the element region 10a is the gate required particularly for size control. It follows that it suffices to arrange the dummy pattern 17 shown in the first embodiment of the present invention in only the region between the adjacent gate patterns 16 arranged on the element regions 10a.

What should also be noted is that severe size control as required for the gate pattern 16 is not required for the dummy pattern 17. Therefore, it suffices for the dummy pattern 17 to have a thickness large enough to prevent the dummy pattern 17 from falling down on the wafer. In other words, it suffices for the width $W_D$ of the dummy pattern 17 to be not smaller than the minimum width $W_G$ of the gate pattern 16. Also, it is possible for the dummy pattern 17 to have an optional pattern shape as far as the conditions described above are satisfied.

As described above, the methods described above make it possible to moderate to some extent the design restrictions described previously in conjunction with the first embodiment of the present invention so as to lessen the burden on by the designer.

[Second Embodiment]

It is highly laborious for the designer to arrange not only the main pattern required for the device but also the dummy pattern as in the first embodiment of the present invention described above. Therefore, it is conceivable to arrange the main pattern alone in the design stage and to arrange the dummy pattern in the stage of conversion of the data of the mask for the light exposure after completion of the design stage. In this case, however, it is impossible to set the design rule using the dummy pattern because the dummy pattern is not arranged in the finishing time of the design, unlike the first embodiment. To be more specific, it is impossible to define the design rule of the G-D distance $X_{G-D}$ described previously in conjunction with the first embodiment of the present invention.

Under the circumstances, the design rule is set in the second embodiment of the present invention such that each of the G-G distance $X_{G-G}$ and the G-D distance $X_{G-D}$ is not rendered larger than the desired maximum distance $X_{max}$ even in this case. In other words, in the second embodiment of the present invention, the main pattern alone is arranged in the design stage, and the dummy pattern for lowering the etching conversion difference is arranged in the data conversion stage after completion of the design.

Figure 7:
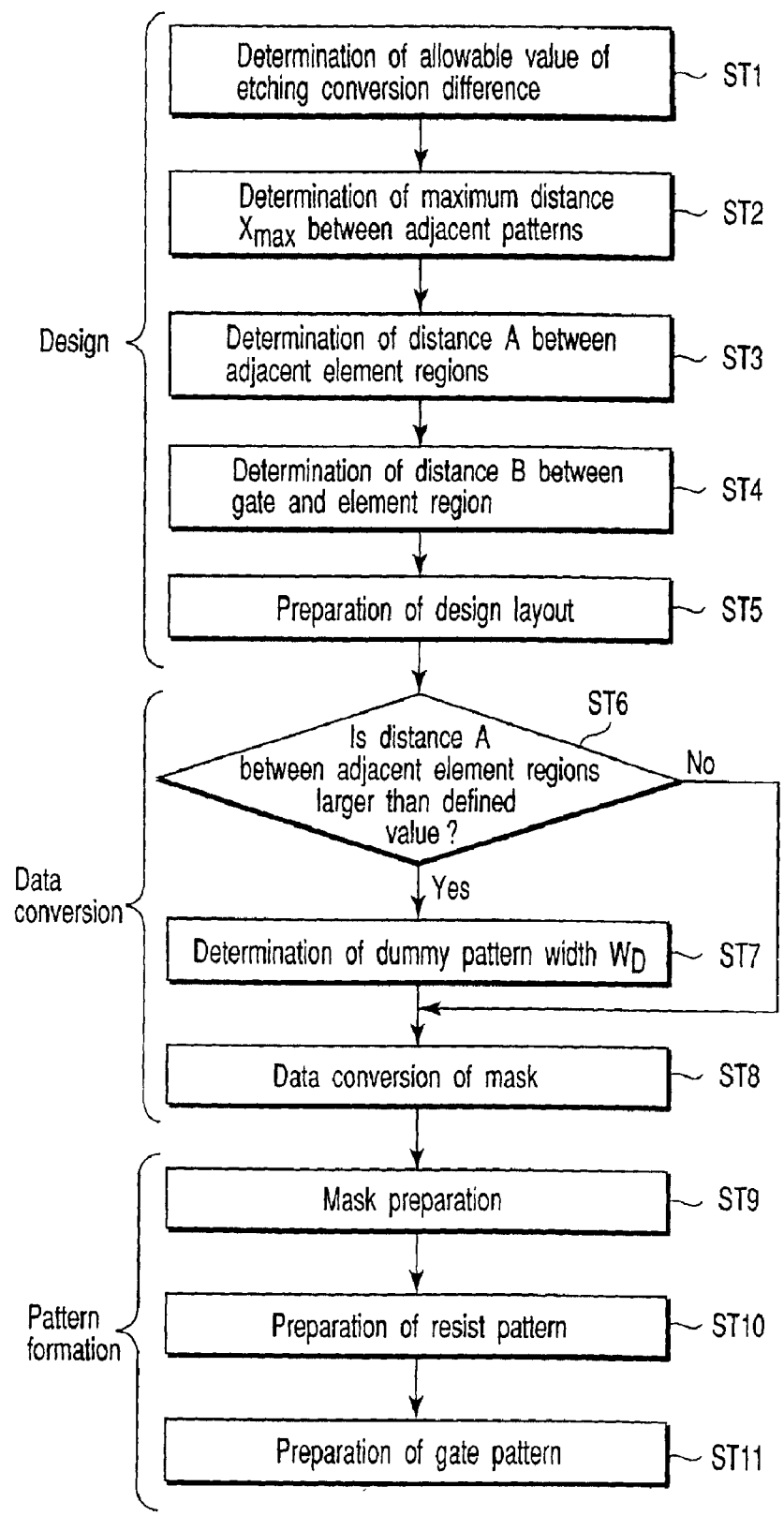
FIG. 7 is a flowchart showing the pattern forming method according to a second embodiment of the present invention.

FIG. 7 is a flowchart showing the pattern forming method according to the second embodiment of the present invention. The pattern forming method according to the second embodiment will now be described according to the flowchart with reference to FIGS. 8A, 8B and 8C. In describing the second embodiment, points similar to those of the first embodiment will be described briefly.

First of all, the allowable value of the etching conversion difference is determined as in the first embodiment (step ST1). Then, the maximum distance $X_{max}$ between the adjacent patterns is obtained for the allowable value of the etching conversion difference noted above (step ST2), followed by determining a distance A between the adjacent element regions 10a (step ST3). Further, a distance B between the gate pattern 16 and the edge portion of the element region 10a is determined in accordance with the distance A between the adjacent element regions 10a such that the distance B not above is not larger than a defined value. The defined value of the distance B is equal to the sum of the size of the contact 18, the deviation amount of the alignment between the contact 18 and the gate pattern 16, and the deviation amount of the alignment between the contact 18 and the diffusion layer within the element region 10a.

Where the distance A between the adjacent element regions 10a is not smaller than the defined value, it is possible to arrange the dummy pattern 17 and, thus, it is possible to increase the distance B between the gate pattern 16 and the edge portion of the element region 10a. On the other hand, where the distance A between the adjacent element regions 10a is not larger than the defined value, it is impossible to arrange the dummy pattern 17 and, thus, it is impossible to increase the distance B between the gate pattern 16 and the edge portion of the element region 10a. Incidentally the defined value of the distance A is equal to the sum of the width $W_D$ of the dummy pattern 17 and the deviation amount of alignment between the diffusion layer within the element region 10a and the gate pattern 16.

As described above, a design layout can be prepared without actually arranging the dummy pattern 17 (step ST5).

Figure 8A:
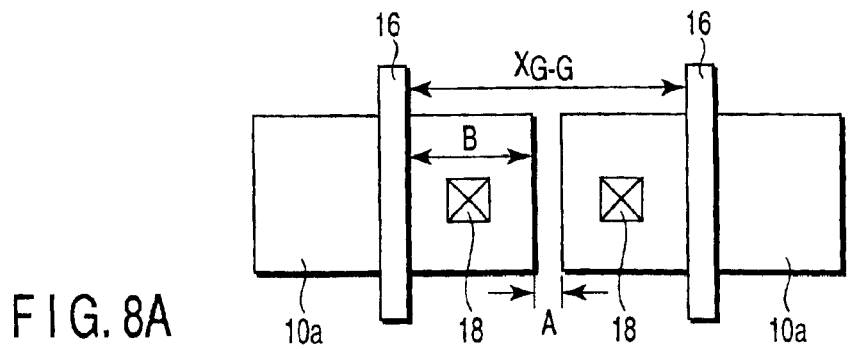
FIGS. 8A, 8B and 8C are cross sectional views showing the pattern forming steps according to the second embodiment of the present invention.
Figure 8B:
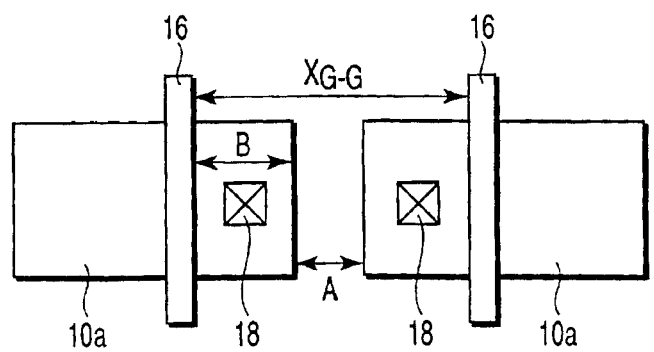
Figure 8C:
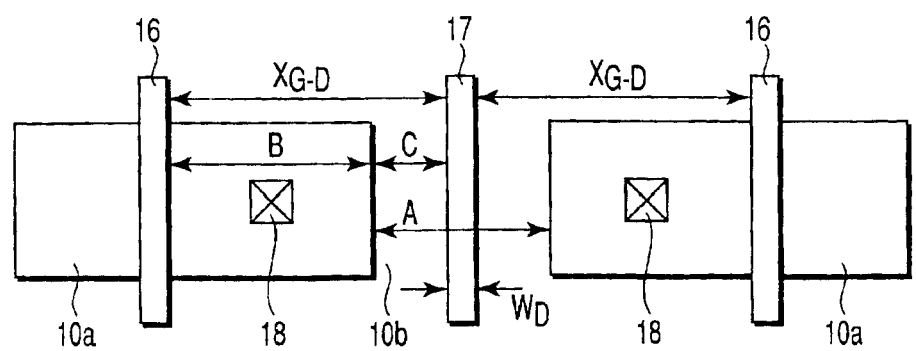

In the next step, it is judged whether or not the dummy pattern 17 should be arranged on the basis of the aspect as to whether the distance A between the adjacent element regions 10a is not smaller than the defined value (step ST6).

Where it has been found that the distance A between the adjacent element regions 10a is not smaller than the defined value, i.e., where the dummy pattern 17 can be arranged as shown in FIG. 8C, the width $W_D$ of the dummy pattern 17 is determined (step ST7). To be more specific, a distance C between the dummy pattern 17 and the element region 10a is set at a value not larger than the defined value, and the width $W_D$ of the dummy pattern 17 is obtained by subtracting a distance, which is double the distance C, from the distance A between the adjacent element regions 10a. Incidentally, it is necessary to set the distance C such that the sum of the distance B and the distance C is not larger than the distance $X_{G-D}$. Also, the defined value of the distance C is set equal to the deviation amount for the alignment between the diffusion layer within the element region 10a and the gate pattern 16. After determination of the width $W_D$ of the dummy pattern 17, the data conversion of the mask is carried out in view of the design layout noted above and the width $W_D$ of the dummy pattern 17 (step ST8).

On the other hand, where the distance A between the adjacent element regions 10a is not larger than the defined value, i.e., where it is impossible to arrange the dummy pattern 17 as shown in FIGS. 8A and 8B, the data conversion of the mask is carried out on the basis of the design layout as described above (step ST8).

Incidentally, the G-G distance $X_{G-G}$ and the G-D distance $X_{G-D}$, which are smaller than the desired maximum distance $X_{max}$, are taken into consideration in performing the data conversion of the mask regardless of the presence or absence of the dummy pattern 17.

Incidentally, an inspection to check that the G-G distance $X_{G-G}$ or the G-D distance $X_{G-D}$ is not larger than the maximum distance $X_{max}$ between the adjacent patterns and an inspection to see whether the dummy pattern 17 can be arranged on the element isolation region 10b alone are performed by using a design rule checker (DRC) in the designing step, after completion of the designing step or in the design data conversion step.

After conversion of the design data of the mask performed as described above, the pattern formation is carried out as in the first embodiment described previously (steps ST9 to ST11).

Incidentally, it is possible to employ electron beam lithography in place of photolithography for forming the resist pattern 16, as in the first embodiment described previously. In this case, the resist layer 13 is patterned by using the converted design data without using a mask.

According to the second embodiment of the present invention described above, the design layout is prepared by determining the maximum distance $X_{max}$ between the adjacent patterns such that the etching conversion difference is rendered not larger than the allowable value, and the generation rule of the dummy pattern 17 is defined after completion of the design. As a result, it is possible to suppress the G-G distance $X_{G-G}$ or the G-D distance $X_{G-D}$ to a level not larger than, for example, 1.5 μm, as in the first embodiment described previously, so as to make it possible to prevent the etching conversion difference from being made larger than the allowable value. As a result, it is possible to correct the change in the size of the isolated pattern derived from the etching process. It follows that it is possible to perform pattern formation with high dimensional accuracy.

Further, an inspection to check that the G-G distance $X_{G-G}$ or the G-D distance $X_{G-D}$ is not larger than the maximum distance $X_{max}$ between the adjacent patterns, e.g., not larger than 1.5 μm, and an inspection to see whether the dummy pattern 17 is arranged on only the element isolation region 10b are applied to the data for the light exposure or the design data by using a design rule checker. As a result, it is possible to prepare a layout small in etching conversion difference on the element isolation region 10b that does not affect the device characteristics. It follows that it is possible to prevent the etching conversion difference from being made larger than the allowable value, e.g., 10 nm, so as to achieve pattern formation with higher dimensional accuracy.

Figure 8D:
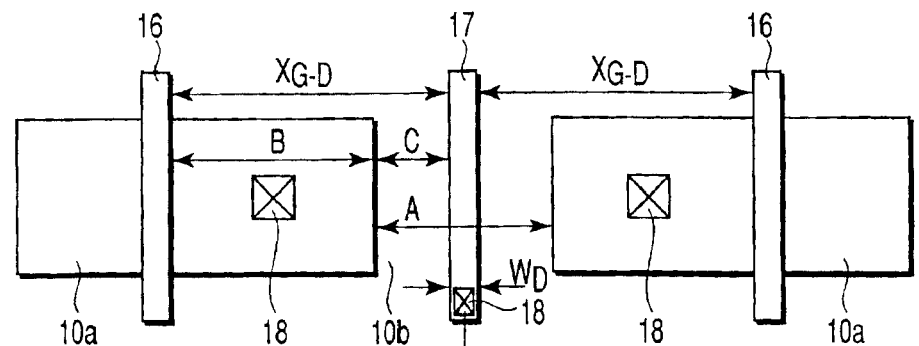
FIG. 8D shows another layout according to the second embodiment of the present invention.

Incidentally, it is possible for the second embodiment to have the construction described below, like the first embodiment described previously. For example, it is possible to arrange the dummy pattern 17 in accordance with the design rule described above in only the case where the width $W_G$ of the gate pattern 16 is not larger than twice the minimum processing size. Also, it is possible to arrange the contact 18 on the dummy pattern 17 and to connect the contact 18 to the metal layer arranged above the dummy pattern 17, as shown in FIG. 8D. Further, it is possible to make the width $W_D$ of the dummy pattern 17 larger than the minimum width $W_G$ of the gate pattern 16. Also, it is possible for the dummy pattern 17 to have any optional pattern shape as far as the conditions described above are satisfied.

Additional advantages and modifications will readily occur to those skilled in the art. Therefore, the present invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for designing a gate wiring pattern, comprising:
   determining an allowable value of an etching conversion difference;
   obtaining a maximum distance between patterns generating said etching conversion difference within said allowable value, said patterns including both main patterns and a dummy pattern, said main patterns being gate wiring patterns, and said dummy pattern being arranged on an element isolation region;
   preparing a design layout in which a first distance between said main patterns and said dummy pattern is smaller than said maximum distance;
   performing a design data conversion based on said design layout to form design data; and
   forming both said main patterns and said dummy pattern by using said design data.

2. The method according to claim 1, wherein said main patterns are arranged on an element region.

3. The method according to claim 1, wherein a width of said dummy pattern is not smaller than a minimum width of said main patterns.

4. The method according to claim 1, wherein said maximum distance is 5 μm or less.

5. The method according to claim 1, wherein said maximum distance is not larger than 10 times a width of said main patterns.

6. The method according to claim 1, wherein an inspection to see whether or not said first distance is not larger then said maximum distance is carried out by using a design rule checker.

7. The method according to claim 1, wherein said dummy pattern is arranged in the case where a width of said main patterns is not larger than twice a minimum processing size.

8. The method according to claim 1, wherein a potential of said dummy pattern is fixed by arranging a contact on said dummy pattern, arranging a metal layer above said dummy pattern, and connecting said contact to said metal layer.

9. The method according to claim 1, wherein said maximum distance is determined in accordance with a width of said main patterns.

10. The method according to claim 1, wherein said main patterns are formed by employing photolithography or electron beam lithography.

11. The method according to claim 1, wherein said dummy pattern is removed after formation of said main patterns.

12. The method according to claim 1 wherein said maximum distance is changed by a thickness or material of said main patterns.

13. A mask manufacturing method comprising:
   forming a gate wiring pattern into a mask, the gate wiring pattern being designed by the design method claims in claim 1.

14. A method of manufacturing semiconductor devices comprising:
   forming a gate wiring using the mask of claim 13.

15. A method of manufacturing semiconductor devices comprising:

forming a gate wiring pattern on a semiconductor substrate, the gate wiring pattern being designed by the design method claimed in claim 1.

16. The method of manufacturing semiconductor devices according to claim 15, wherein the gate wiring pattern is formed using electron-beam lithography.

17. A method for designing a gate wiring pattern, comprising:
   determining an allowable value of an etching conversion difference;
   obtaining a maximum distance between patterns generating said etching conversion difference within said allowable value, said patterns including both main patterns and a dummy pattern, said main patterns being gate wiring patterns, and a width of said dummy pattern not being smaller than a minimum width of said main patterns;
   preparing a design layout in which a first distance between said main patterns and said dummy pattern is smaller than said maximum distance;
   performing a design data conversion based on said design layout to form design data; and
   forming both said main patterns and said dummy pattern by using said design data.

18. A designing method for designing a gate wiring pattern, comprising:
   determining an allowable value of an etching conversion difference;
   obtaining a maximum distance between patterns generating said etching conversion difference within said allowable value, said patterns including both main patterns and a dummy pattern, said main patterns being gate wiring patterns, and said dummy pattern being arranged on an element isolation region;
   determining a third distance between adjacent element regions;
   preparing, in accordance with said third distance a design layout in which a fourth distance between said main patterns and edge portions of said element regions is not larger than a first defined value;
   determining a width of said dummy pattern and performing conversion of a design data in view of said design layout, said width of said dummy pattern, and a first distance between said main patterns and said dummy pattern to prepare a design data in the case where said third distance is not smaller than said second defined value, said first distance being not larger than said maximum distance; and
   forming both said main patterns and said dummy pattern by using said design data.

19. The method according to claim 18, wherein said main patterns are arranged on an element region.

20. The method according to claim 18, wherein the width of said dummy pattern is not smaller than a minimum width of said main patterns.

21. The method according to claim 18, wherein said maximum distance is 5 µm or less.

22. The method according to claim 18, wherein said maximum distance is not larger than 10 times a width of said main patterns.

23. The method according to claim 18, wherein an inspection to see whether or not said first distance is not larger than said maximum distance is carried out by using a design rule checker.

24. The method according to claim 18, wherein said dummy pattern is arranged in the case where a width of said main patterns is smaller than twice a minimum processing size.

25. The method according to claim 18, wherein a potential of said dummy pattern is fixed by arranging a contact on said dummy pattern, arranging a metal layer above said dummy pattern, and connecting said contact to said metal layer.

26. The method according to claim 18, wherein said maximum distance is determined in accordance with a width of said main patterns.

27. The method according to claim 18, wherein said main patterns are formed by employing photolithography or electron beam lithography.

28. The method according to claim 18, wherein said dummy pattern is removed after formation of said main patterns.

29. The method according to claim 18, wherein said maximum distance is changed by a thickness or material of said main patterns.

30. The method according to claim 18, wherein said first defined value is equal to the sum of a size of a contact within said element region, a deviation amount of an alignment between said contact and a diffusion layer within said element region, and a deviation amount of an alignment between said contact and said main patterns.

31. The method according to claim 18, wherein said second defined value is equal to the sum of said width of said dummy pattern and a deviation amount of an alignment between a diffusion layer within said element region and said main patterns.

32. The method according to claim 18, wherein said width of said dummy pattern is equal to a width obtained by subtracting a value twice as much as a fifth distance from said third distance, said fifth distance is a distance between said dummy pattern and said element region, and said fifth distance is not larger than a third defined value.

33. The method according to claim 32, wherein said third defined value is equal to a deviation amount of an alignment between a diffusion layer within said element region and said main patterns.

34. The method according to claim 32, wherein the sum of said fourth distance and said fifth distance is not larger than said maximum distance.

35. A designing method for designing a gate wiring pattern, comprising:
   determining an allowable value of an etching conversion difference;
   obtaining a maximum distance between patterns generating said etching conversion difference within said allowable value, said patterns including both main patterns and a dummy pattern, and said main patterns being gate wiring patterns;
   determining a third distance between adjacent element regions;
   preparing in accordance with said third distance a design layout in which a fourth distance between said main patterns and edge portions of said element regions is not larger than a first defined value;
   determining a width of said dummy pattern and performing conversion of a design data in view of said design layout, said width of said dummy pattern, and a first distance between said main patterns and said dummy pattern to prepare a design data in the case where said third distance is not smaller than said second defined value, said first distance being not larger than said maximum distance, the width of said dummy pattern not being smaller than a minimum width of said main patterns; and
   forming both said main patterns and said dummy pattern by using said design data.

36. A semiconductor device comprising:

main patterns arranged such that a distance between the patterns is not larger than a maximum distance between adjacent patterns, said maximum distance being defined from an etching conversion difference; and a dummy pattern arranged between said main patterns, the width of said main patterns being smaller than twice a minimum processing size, and the distance between said main patterns and said dummy pattern being not larger than said maximum distance.

37. The semiconductor device according to claim 36, wherein said main patterns are arranged on an element region.

38. The semiconductor device according to claim 36, wherein said main patterns are gate patterns or wiring patterns.

39. The semiconductor device according to claim 36, wherein said maximum distance is 5 $\mu$m or less.

40. The semiconductor device according to claim 36, wherein said maximum distance is not larger than 10 times a width of said main patterns.

41. The semiconductor device according to claim 36, wherein said maximum distance is determined in accordance with a width of said main patterns.

42. The semiconductor device according to claim 36, wherein said dummy pattern is arranged on an element isolation region.

43. The semiconductor device, according to claim 36, wherein a width of said dummy pattern is not smaller than a minimum width of said main patterns.

44. The semiconductor device according to claim 36, further comprising:

a contact arranged on said dummy pattern; and metal layer arranged above said dummy pattern and connected to said contact to fix a potential of said dummy pattern.

\* \* \* \* \*

UNITED STATES PATENT AND TRADEMARK OFFICE
CERTIFICATE OF CORRECTION

PATENT NO. : 6,901,577 B2
DATED : May 31, 2005
INVENTOR(S) : Kotani et al.

It is certified that error appears in the above-identified patent and that said Letters Patent is hereby corrected as shown below:

Column 10,
Line 37, change "larger then" to -- larger than --.
Line 56, change "claim 1" to -- claim 1, --.

Column 14,
Line 15, change "metal layer" to -- a metal layer --.

Signed and Sealed this

Thirtieth Day of August, 2005

JON W. DUDAS
*Director of the United States Patent and Trademark Office*